United States Patent
Sim et al.

(10) Patent No.: US 6,545,923 B2
(45) Date of Patent: Apr. 8, 2003

(54) NEGATIVELY BIASED WORD LINE SCHEME FOR A SEMICONDUCTOR MEMORY DEVICE

(75) Inventors: Jae-Yoon Sim, Kyunggi-do (KR); Jei-Hwan Yoo, Kyunggi-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/901,785

(22) Filed: Jul. 9, 2001

(65) Prior Publication Data

US 2002/0163843 A1 Nov. 7, 2002

Related U.S. Application Data

(60) Provisional application No. 60/288,744, filed on May 4, 2001.

(51) Int. Cl.[7] ................................................. G11C 8/08
(52) U.S. Cl. ................... 365/204; 365/230.06; 365/228; 365/227; 365/226
(58) Field of Search ........................... 365/204, 230.06, 365/227, 228, 226, 195, 191

(56) References Cited

U.S. PATENT DOCUMENTS

| | | | |
|---|---|---|---|
| 5,416,748 A | 5/1995 | Fujita | 365/230.06 |
| 5,596,542 A | 1/1997 | Sugibayashi et al. | 365/230.06 |
| 5,659,502 A * | 8/1997 | Sali et al. | 365/185.18 |
| 5,764,585 A | 6/1998 | Matsubara | 365/230.06 |
| 5,781,498 A | 7/1998 | Suh | 365/230.06 |
| 5,920,505 A * | 7/1999 | Sali et al. | 365/185.18 |
| 5,986,966 A | 11/1999 | Nagata | 365/230.06 |
| 6,088,286 A | 7/2000 | Yamauchi et al. | 365/230.06 |
| 6,335,893 B1 * | 1/2002 | Tanaka et al. | 365/226 |

FOREIGN PATENT DOCUMENTS

KR    2000-0045870    7/2000    ......... G11C/11/407

* cited by examiner

*Primary Examiner*—Andrew Q. Tran
(74) *Attorney, Agent, or Firm*—Marger Johnoson & McCollom, P.C.

(57) ABSTRACT

A memory device utilizing a negatively biased word line scheme diverts word line discharge current from the negative voltage source during a precharge operation, thereby reducing voltage fluctuations and current consumption from the negative voltage source. A main word line, sub-word line, word line enable signal, or other type of word line is coupled to the negative voltage source during a precharge operation. The word line is also coupled to a second power supply during the precharge operation, and then uncoupled from the second power supply after most of the word line discharge current has been diverted. The negative voltage source can then discharge and maintain the word line at a negative bias.

70 Claims, 15 Drawing Sheets

NEGATIVELY BIASED WORD LINE SCHEME FOR A SEMICONDUCTOR MEMORY DEVICE

This application claims priority from Provisional Application No. 60/288,744, entitled WORD LINE DRIVER FOR A SEMICONDUCTOR MEMORY DEVICE, filed on May 4, 2001, by the same inventors of the present application, the contents of which are herein incorporated by reference.

BACKGROUND

1. Field of the Invention

The present invention relates generally to semiconductor memory devices, and more particularly, to word line driver circuits for semiconductor memory devices.

2. Description of the Related Art

FIG. 1 illustrates a memory cell in a typical DRAM memory device. The refresh time of this memory cell is degraded by two major types of leakage current: $I_1$ which is the junction leakage current caused by defects at the junction boundary of transistor M1; and $I_2$ which is the channel leakage caused by sub-threshold current flowing through transistor M1. The junction leakage current $I_1$ can be reduced by decreasing the channel implantation dose, but this causes $I_2$ to increase. Similarly, the sub-threshold current $I_2$ can be reduced by increasing the threshold voltage Vth of M1, but this causes $I_1$ to increase.

A negatively biased word line scheme has been devised to reduce both the junction leakage current and the channel leakage current in the same time. A memory device employing a negative word line scheme applies a negative voltage Vbb (typically −0.4 to −0.5 Volts) to the word lines of non-selected memory cells. The implementation of negatively biased word line schemes, however, present numerous problems. First, a large negative voltage source is required to handle the high discharge currents that are generated when a word line is discharge from Vpp or Vdd to Vbb during a precharge operation. These discharge currents also tend to cause voltage fluctuations in Vbb. The current required to operate the word line control circuitry places additional demands on the negative voltage source. Thus, the negative voltage source tends to take up a large amount of space in a memory device. Second, conventional negative word line schemes require complex implementations that typically carry a chip area penalty because one negative word line driver is required per word line. Moreover, it is difficult to implement a negative voltage converter within a word line driver pitch.

SUMMARY

A negative word line drive scheme in accordance with the present invention diverts word line discharge current away from the negative voltage source during a precharge operation.

One aspect of the present invention is a method for discharging a word line comprising: coupling the word line to a first power supply; and diverting current from the word line to a second power supply.

Another aspect of the present invention is a semiconductor memory device comprising: a word line; and a word line driver circuit coupled to the word line and adapted to couple the word line to a first power supply during a precharge operation; wherein the word line driver circuit is adapted to divert word line discharge current to a second power supply during the precharge operation.

A further aspect of the present invention is a semiconductor memory device comprising: a word line; means for coupling the word line to a first power supply during a precharge operation; and means for diverting current from the word line to a second power supply during the precharge operation.

These and other aspects of the present invention are disclosed and claimed.

DETAILED DESCRIPTION

Main Word Line Driver Scheme

Figure 1:
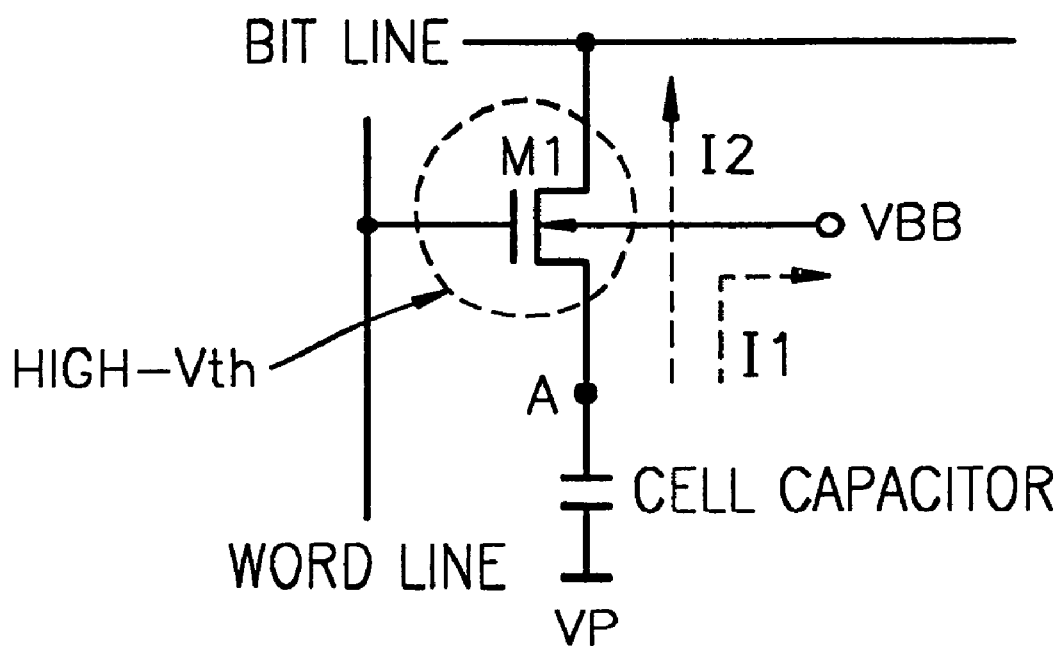
FIG. 1 illustrates a prior art memory cell in a DRAM memory device.
Figure 2:
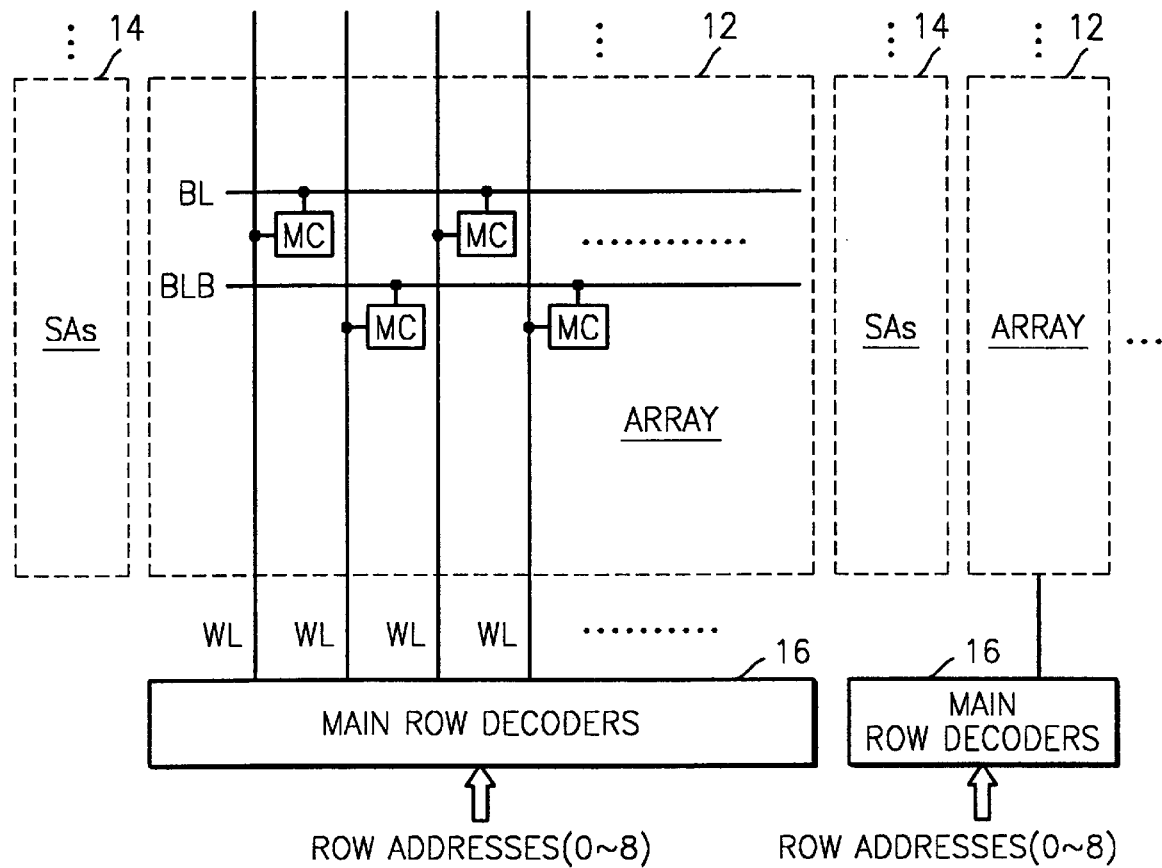
FIG. 2 illustrates the core structure of a prior art DRAM device utilizing a main word line driver scheme.

FIG. 2 illustrates the core structure of a prior art DRAM device utilizing a main word line driver scheme. The core structure shown in FIG. 2 includes memory cell arrays 12, sense amplifier blocks 14, and main row decoders 16. Within each memory cell array 12, are individual memory cells MC, each having a cell transistor and cell capacitor located at the intersection of a bit line BL/BLB and a main word line WL. The word lines WL for non-selected memory cells are held at the power supply ground voltage Vss. When a memory cell MC is accessed (for example, during a read operation) the corresponding word line is typically driven to a boosted voltage Vpp which turns on the access transistor and allows a sense amplifier in the sense amplifier block 14 to sense the state of the cell capacitor through bit lines BL/BLB.

Figure 3:
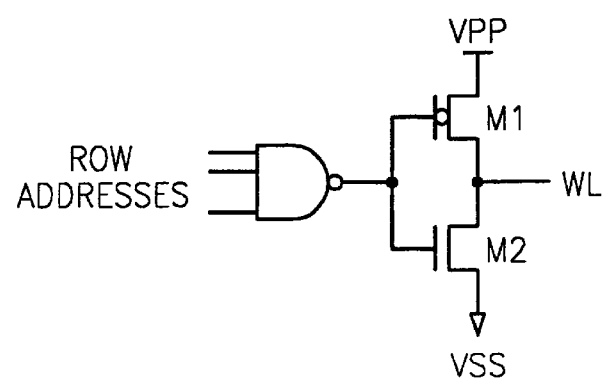
FIG. 3 is a schematic diagram of a prior art word line driver.

Because each of the main word lines WL is coupled to numerous memory cells, they present heavy capacitive loads. Therefore, the main row decoders 18 contain word line drivers such as that shown in FIG. 3. Here, the word line driver is a simple push-pull stage formed from stacked PMOS transistor M1 and NMOS transistor M2. The source of M2 is connected to Vss in a conventional memory device. During a precharge operation (after the access of a memory cell is completed), large amounts of current flow to Vss through M2 as the word line WL is discharged. In a memory device employing a negative word line scheme, the source of M2 would be connected to the negative power supply Vbb so that the word line is maintained at Vbb to reduce leakage in the access transistors. However, this causes large discharge currents to flow to Vbb during a precharge operation, thereby causing voltage fluctuations in Vbb and other problems.

Embodiment 1

Figure 4:
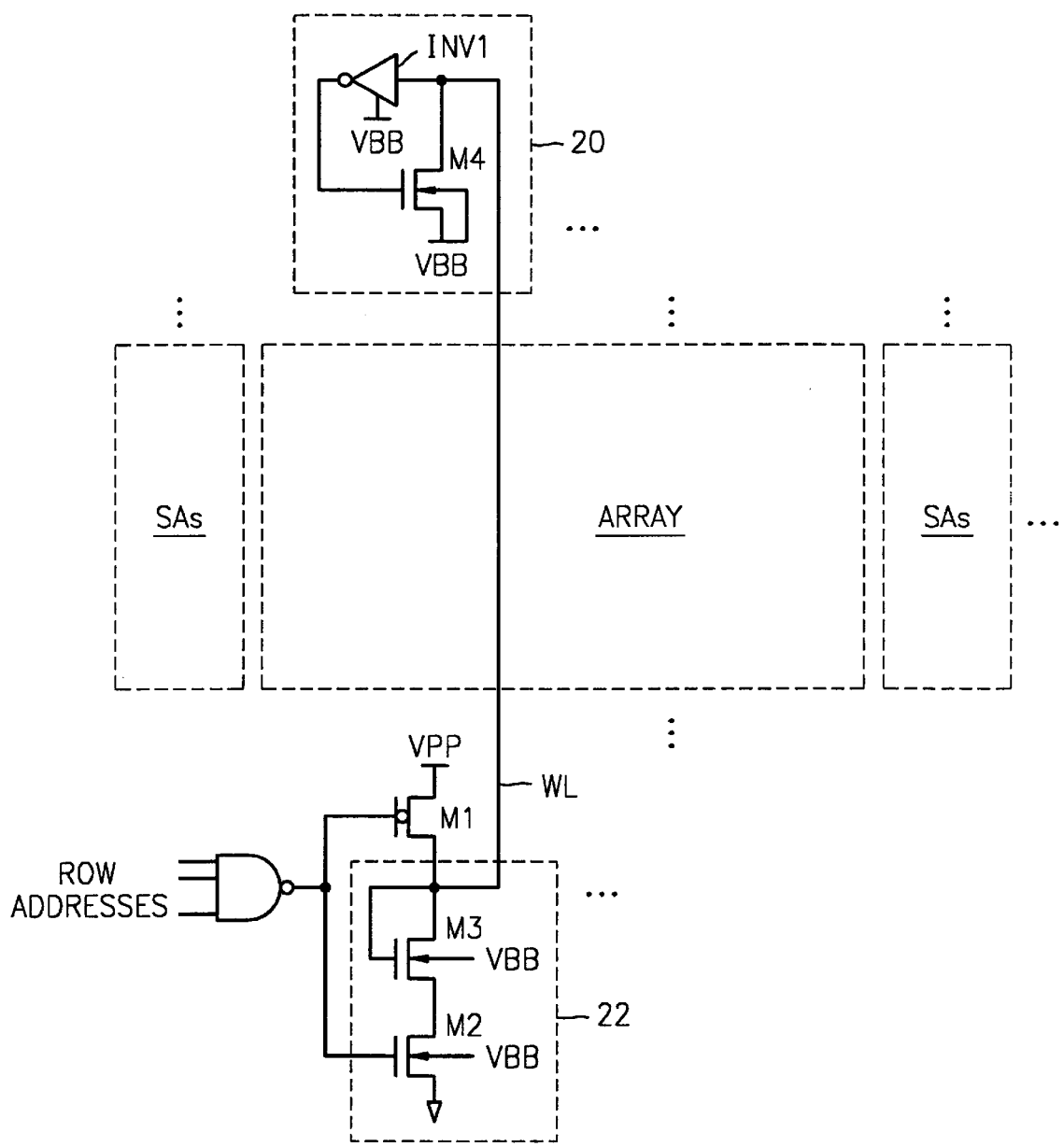
FIG. 4 illustrates a first embodiment of a memory device in accordance with the present invention.

FIG. 4 illustrates a first embodiment of a memory device in accordance with the present invention. The drive circuit shown in FIG. 4 is constructed so that it maintains the word line WL at Vbb after a precharge operation, but diverts most of the word line discharge current to Vss, thereby reducing the demand on the negative power supply. The drive circuit of FIG. 4 includes a power supply keeping circuit (or "keeping circuit") 20 and a drive stage 18 having a modified driver section 22. The keeping circuit 20 includes an NMOS transistor M4 having a channel connected between WL and Vbb, and a gate connected to the output of an inverter INV1, and a substrate connected to Vbb. The inverter INV1 is referenced to Vbb and has an input connected to the word line. In the modified driver section 22, a diode connected NMOS transistor M3 is connected in series with M2. The substrates of both M2 and M3 are connected to Vbb. The keeping circuit 20 is preferably located on the side of the cell array opposite from the rest of the main row decoder to save space in the decoder region.

A precharge operation in accordance with the present invention will now be described with reference to FIG. 4. At the end of an access operation, the word line WL is at Vpp because transistor M1 is on. The output of inverter INV1 is low, transistors M2 and M4 are off, and diode-connected transistor M3 does not conduct current. When the word line is deactivated in response to a changing row address, transistor M1 turns off, M2 turns on, and discharge current from the word line flows to Vss through M2 and M3. That is, word line discharge current is diverted to Vss because the word line is coupled to Vss through M2 and M3 in response to the changing address.

When the voltage of the word line drops below the switching point of INV1, the output of INV1 goes high, M4 turns on, and the word line is pulled down to Vbb because it is coupled to Vbb through M4 in response to the decreasing voltage of the word line. By the time the voltage of the word line drops low enough to switch the inverter INV1, most of the discharge current from the word line has already been diverted to Vss, so very little current is required to maintain the word line at Vbb.

The diode-connected transistor M3 prevents current from flowing back out of Vss through M2 when the keeping circuit is enabled. That is, M3 uncouples the word line from Vss in response to the voltage of the word line after a substantial amount of word line discharge current has been diverted to Vss. The substrates of M2 and M3 are also connected to Vbb to prevent current flow through these transistors when the keeping circuit is enabled.

An advantage of the arrangement shown in FIG. 4 is that it reduces the current consumption from the negative voltage source because most of the word line discharge current is diverted to Vss. A further advantage is that it minimizes the Vbb current required for the word line control circuitry. Yet another advantage is that the word line driver circuitry fits within the word line pitch.

Embodiment 2

Figure 5:
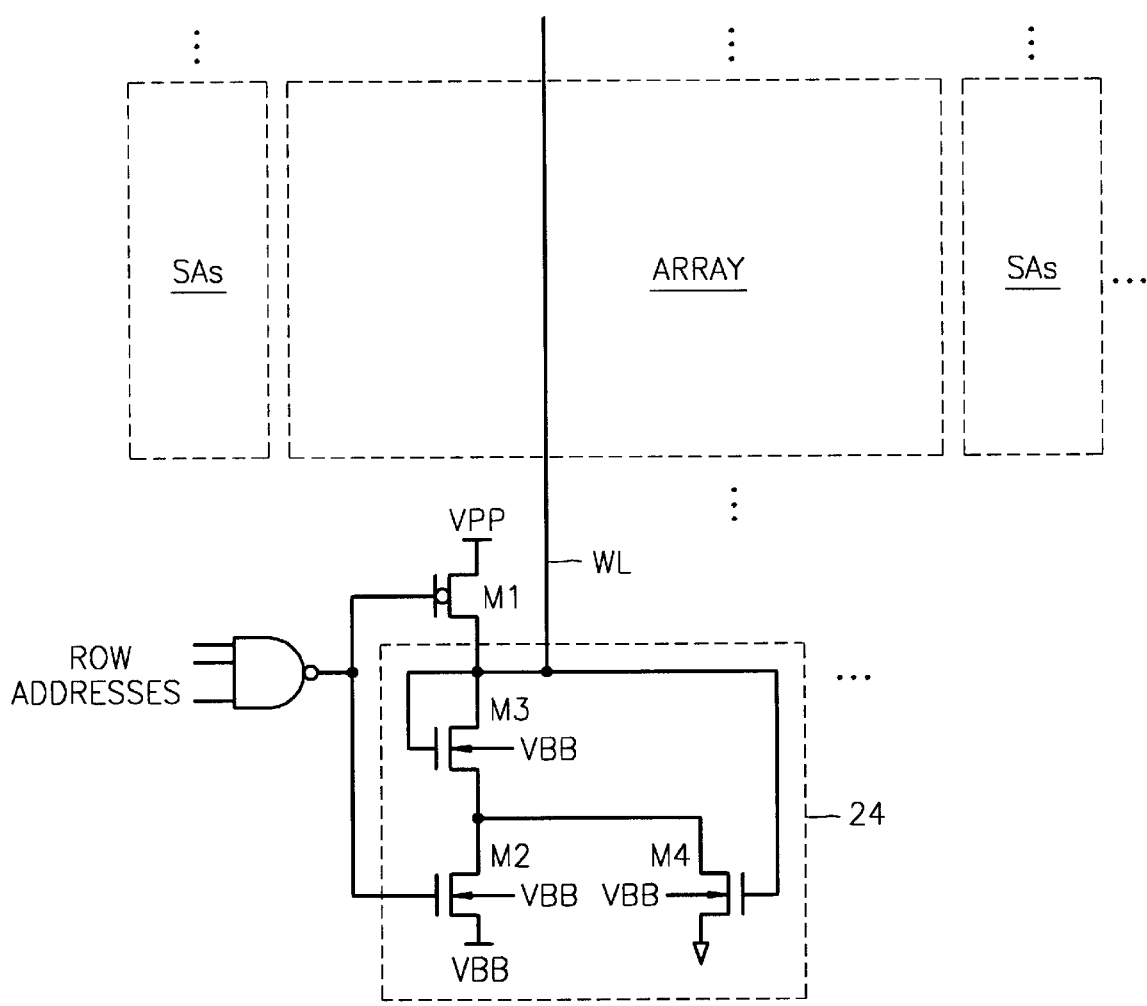
FIG. 5 illustrates a second embodiment of a memory device in accordance with the present invention.

FIG. 5 illustrates a second embodiment of a memory device in accordance with the present invention. The drive circuit shown in FIG. 5 is different from FIG. 4 in that the keeping circuit is eliminated, and the modified driver section 24 has further modifications including a large NMOS pull-down transistor M2. The source of M2 is connected to Vbb, and the gate of M1 is connected to the output of the row decoder along with the gate of M2. The channel of M4 is connected between the drain of M2 and Vss, and the gate of M4 is connected to the word line WL. The substrates of M2, M3, and M4 are all connected to Vbb. Thus, transistor M4 now diverts word line discharge current to Vss by coupling the word line to Vss responsive to the word line voltage, provided M3 is turned on. Transistor M2 now couples the word line to Vbb responsive to row address information.

At the end of an access operation, the word line is at Vpp, and M4 is on, but no current flows through M4 because M2 and M3 are turned off by the row decoder. As the precharge operation begins, M2 and M3 turn on, but most of the word line discharge current flows to Vss through M4 because M4 is much larger than M2. When the word line voltage reaches the threshold voltage Vth of M3, the rest of the word line discharge current flows through M1 and M2 as WL is pulled down to Vbb.

The arrangement shown in FIG. 5 has many of the same advantages as that of FIG. 4 with the further advantage that the keeping circuit is eliminated, although the addition of M4 requires more area in the decoder region.

Embodiment 3

Figure 6:
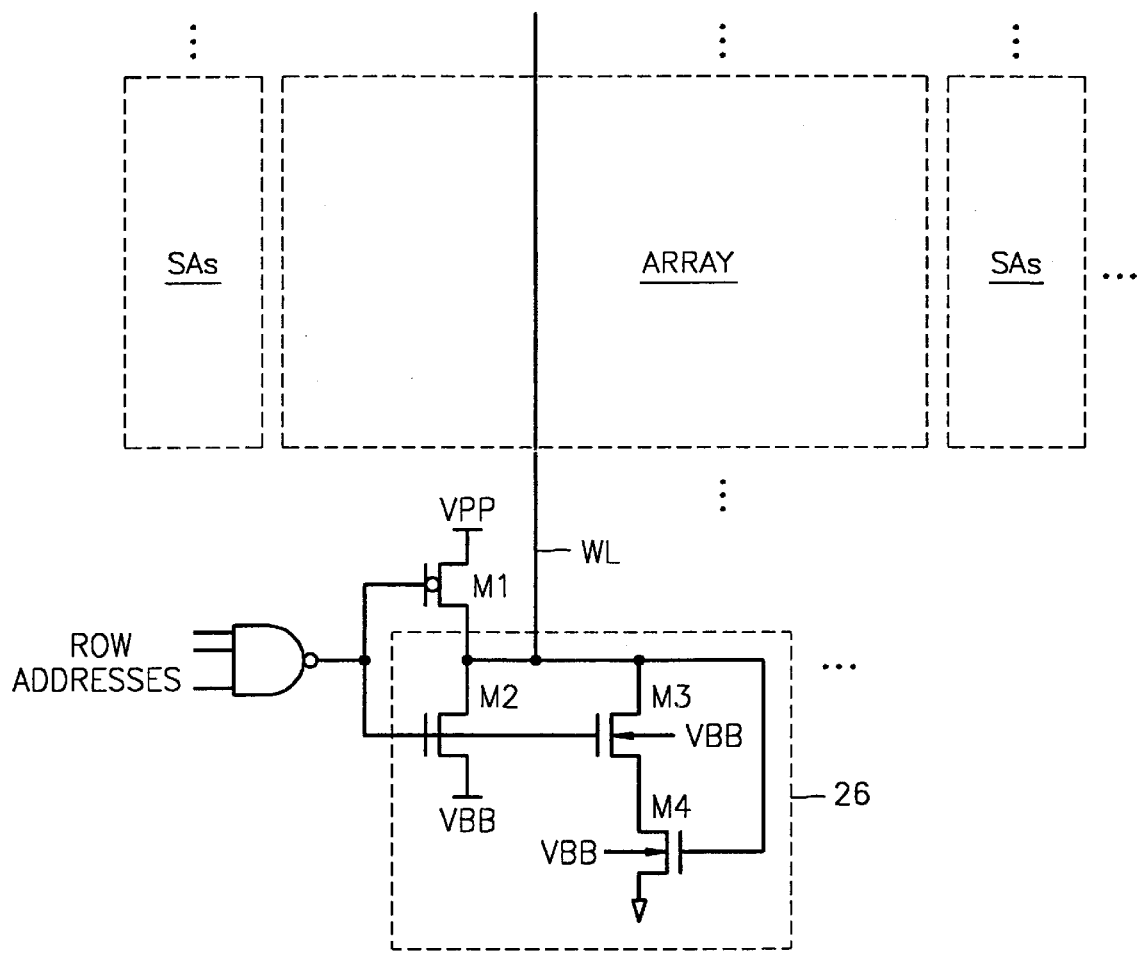
FIG. 6 illustrates a third embodiment of a memory device in accordance with the present invention.

FIG. 6 illustrates a third embodiment of a memory device in accordance with the present invention. The structure and operation of the drive circuit shown in FIG. 6 are similar to those of FIG. 5, but transistor M3 has been moved in series with M4 instead of M2.

Sub-Word Line Driver Scheme

Figure 7:
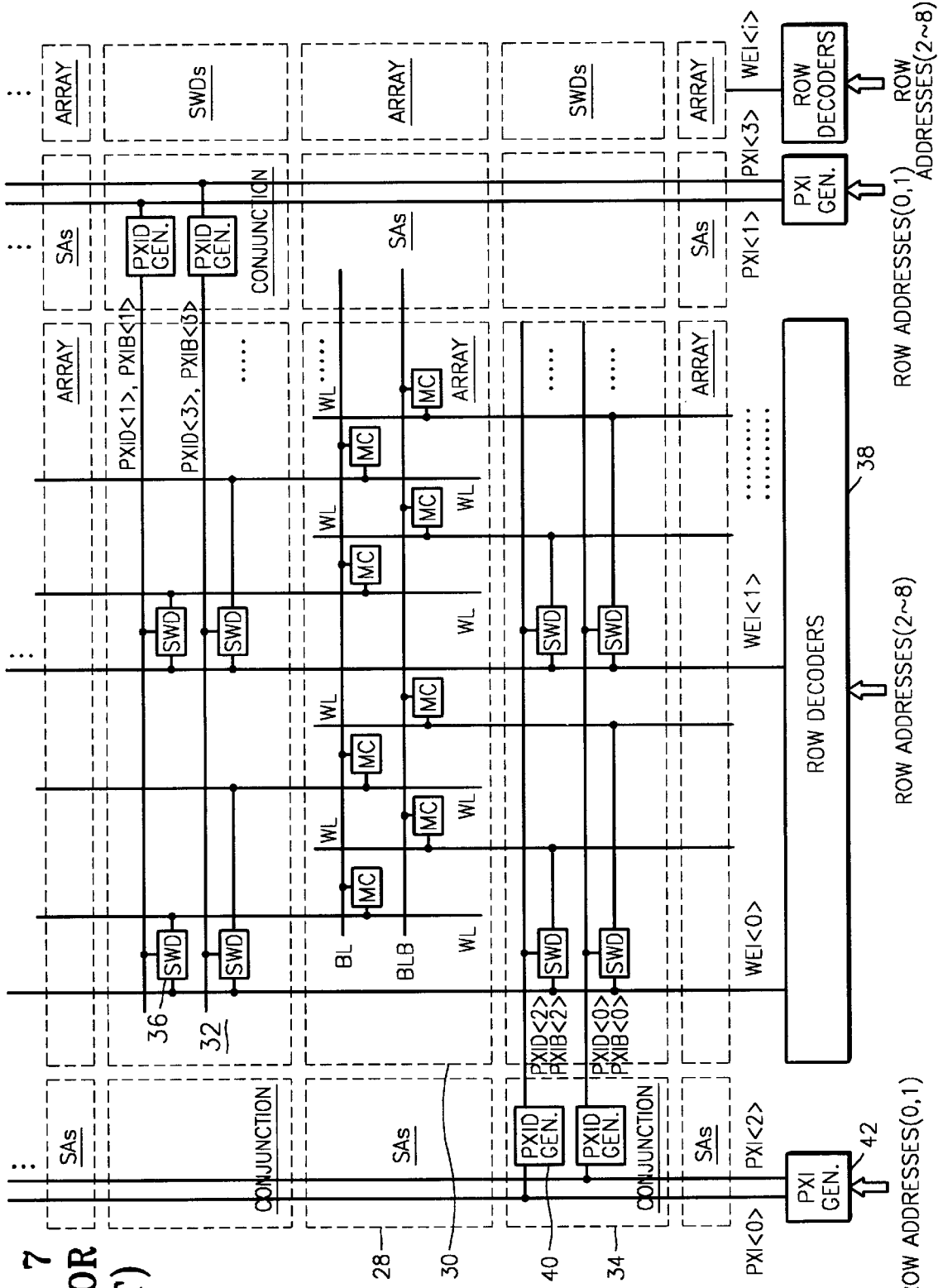
FIG. 7 illustrates the core structure of a prior art DRAM device utilizing a sub-word line driver scheme.

The principles of the present invention discussed above with respect to memory devices having a main word line scheme can be extended to other types of memory devices, including, for example, memory devices utilizing a sub-word line driver scheme. FIG. 7 illustrates the core structure of a typical prior art DRAM device utilizing a sub-word line driver scheme. This type of memory device is disclosed in U.S. Pat. Nos. 5,416,748; 5,596,542; 5,764,585; 5,781,498; and 5,986,966 but it will be summarized briefly here for convenience.

The core structure shown in FIG. 7 includes sense amplifier blocks 28, cell arrays 30, sub-word line driver blocks 32, and conjunction circuitry 34. Within each memory cell array 30, are individual memory cells MC, each having a cell transistor and cell capacitor located at the intersection of a bit line BL/BLB and a sub-word line WL. The sub-word lines WL are driven by sub-word line drivers 36 located within sub-word line driver blocks 32. Each of the sub-word line drivers 36 is controlled by one of the word line enable lines WEI from main row decoder 38 and a PX line which is a type of word line that is distributed throughout the device as described below.

Main row decoder 38 generates 64 word line enable signals WEI<0:63> in response to the seven upper address bits ADDRESS(2–8). These signals are buffered by drivers 39 which are shown outside of the decoder 38, but can also be inside the decoder. The word line enable signals of FIG. 7 operate in much the same manner as the main word lines in FIG. 2, except that they are connected to the sub-word line drivers 36 rather than being connected directly to access transistors in the memory cells.

The remaining word lines PXI<0:3>, however, are driven by PXI generators/decoders 42 in response to the two lower address bits ADDRESS(0–1). These PX signals are distributed throughout the memory device by word line drive circuitry which is itself distributed throughout the device. The PXI lines drive PXID generators 40 which are typically located in the conjunction circuitry 34. The PXID generators, in turn, drive the PXID/PXIB lines which are complementary signal lines that drive the sub-word line drivers 36.

All of the sub-word lines WL are normally precharged to Vss. When a memory cell is accessed, the corresponding word line enable signals WEI and PXID/B signals are activated. This causes the corresponding sub-word line driver SWD to drive the corresponding sub-word line to Vpp. After the access operation is complete, the sub-word line driver precharges the sub-word line WL to Vss.

Distributing the PX lines and word line driver circuitry throughout the device allows the memory device to operate at higher speeds.

Figure 8:
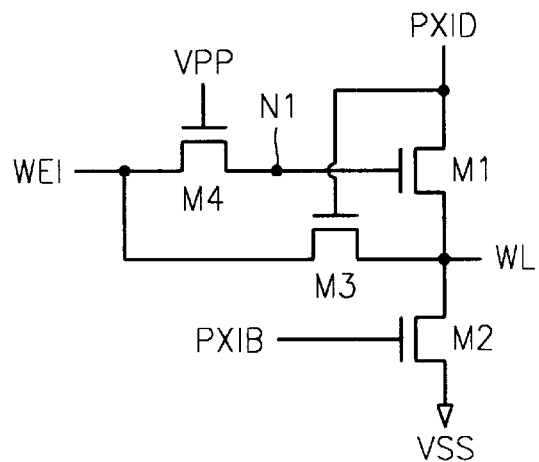
FIG. 8 is a schematic diagram of a prior art NMOS sub-word line driver.
Figure 9:
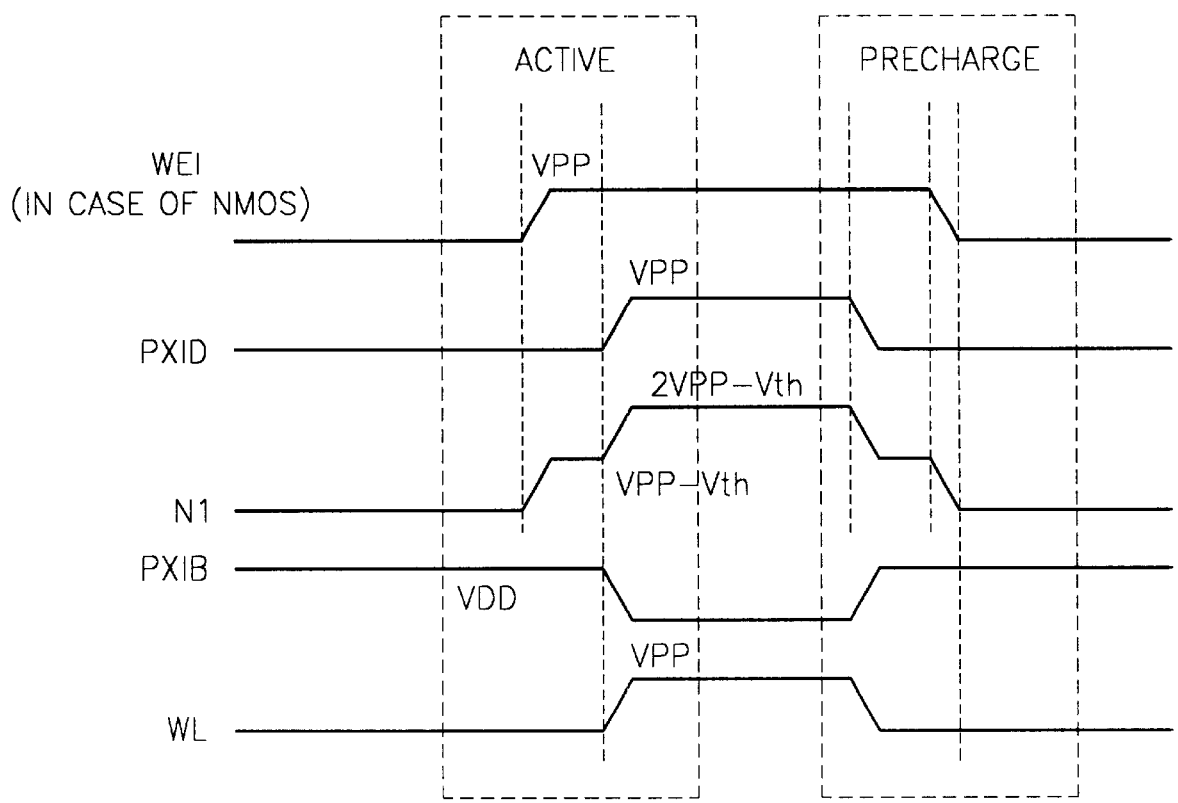
FIG. 9 is a timing diagram illustrating one cycle of the operation of the NMOS-type sub-word line driver of FIG. 8.

FIG. 8 illustrates a typical prior art NMOS-type sub-word line driver circuit. The structure and operation of this circuit will be described with reference to FIGS. 8 and 9. Before an active operation, all of the signal lines shown in FIG. 9 are at Vss except PXIB, which is an active low signal. To begin the active operation, WEI is first driven to Vpp. This causes node N1 to switch to Vpp-Vth (assuming 100 percent pumping efficiency), where Vth is the threshold voltage of M4. Node N1 remains in a floating state because the gate-to-source voltage of M4 is Vth. A short time later, when PXID is driven to Vpp, node N1 is boosted to 2Vpp-Vth (again, assuming 100 percent pumping efficiency) because of the drain-to-gate coupling capacitance of M1. PXID then supplies sufficient current through M1 for the word line WL to reach the Vpp level.

During the precharge operation, the timing sequence is reversed, and the word line WL is discharged. Most of the word line discharge current flows through M1 because the width/length ratio of M1 is much larger than that of M2.

Figure 10:
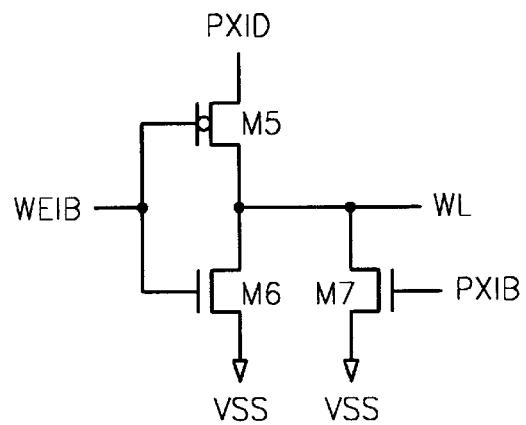
FIG. 10 is a schematic diagram of a prior art CMOS sub-word line driver.
Figure 11:
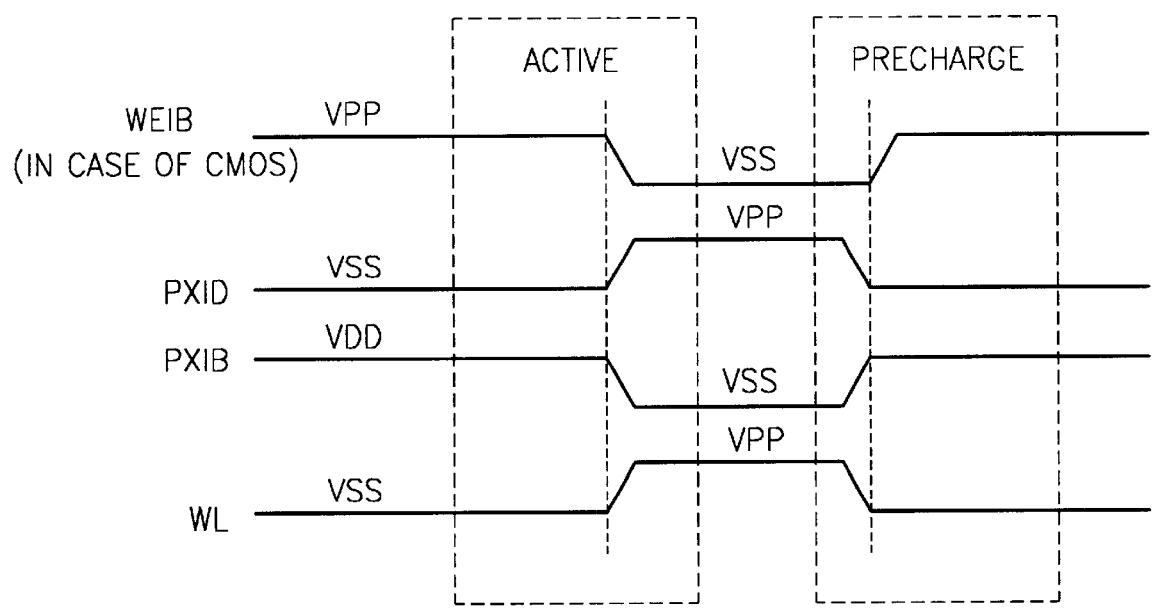
FIG. 11 is a timing diagram illustrating one cycle of the operation of the CMOS-type sub-word line driver of FIG. 10.

FIG. 10 illustrates a typical prior art CMOS-type sub-word line driver circuit. The structure and operation of this circuit will be described with reference to FIGS. 10 and 11. In the CMOS implementation, WEIB (the complement of WEI) is used as the word line enable signal. Before an active operation, all of the signal lines shown in FIG. 11 are in their inactive states. To begin an active operation, WEIB switches from Vpp to Vss at the same time PXID goes from Vss to Vpp. This causes PXID to charge the sub-word line WL to Vpp through M5.

During the precharge operation, the timing sequence is reversed, and the word line WL is discharged to Vss. During the early part of the precharge operation, most of the word line discharge current flows through M5 because its width/length ratio is much larger than that of M7. When the sub-word line voltage reaches the threshold voltage Vth of M5, transistor M5 turns off and the remaining discharge current flows through M6 and M7.

The CMOS implementation of the sub-word line driver circuit shown in FIG. 10 is a simpler circuit than that shown in FIG. 8, but the PMOS transistor M5 takes up extra room because it requires a separate well on a semiconductor chip.

Figure 12:
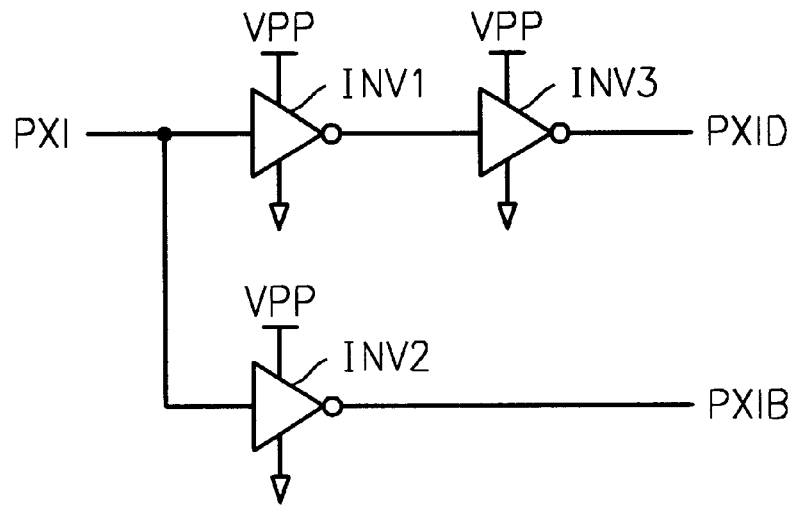
FIG. 12 is a schematic diagram of a prior art PXID generator.

FIG. 12 is a schematic diagram of a prior art PXID generator circuit 40. The circuit of FIG. 12 generates the complementary signals PXID and PXIB which are typically used to drive the sub-word line driver circuit 36 in FIG. 7, as well as those in FIGS. 8 and 10. The voltage swings of PXID and PXIB are typically Vss-to-Vpp and Vss-to-Vdd, respectively. Inverter INV3 is usually fabricated with large transistor because it supplies the most of the charging and discharging current for the sub-word lines.

Figure 13:
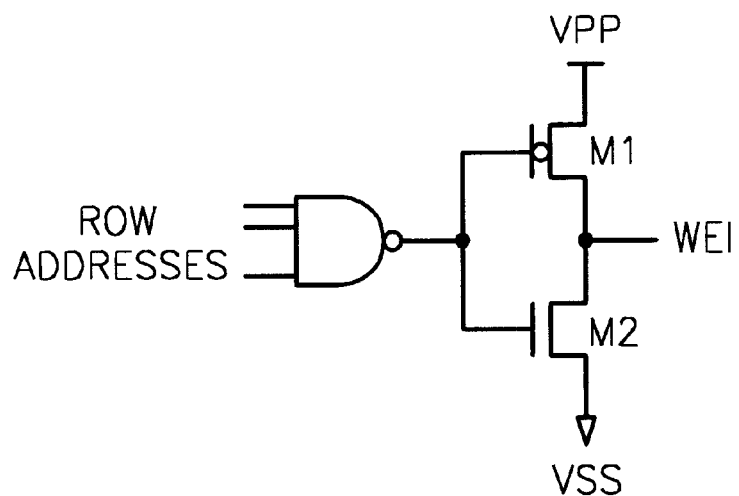
FIG. 13 is a schematic diagram of a prior art WEI generator.

FIG. 13 is a schematic diagram of a prior art drive circuit 39 used to drive the word lines enable signals WEI shown in FIG. 7, which in turn, drive the sub-word line driver circuits shown in FIGS. 8 and 10.

Figure 14:
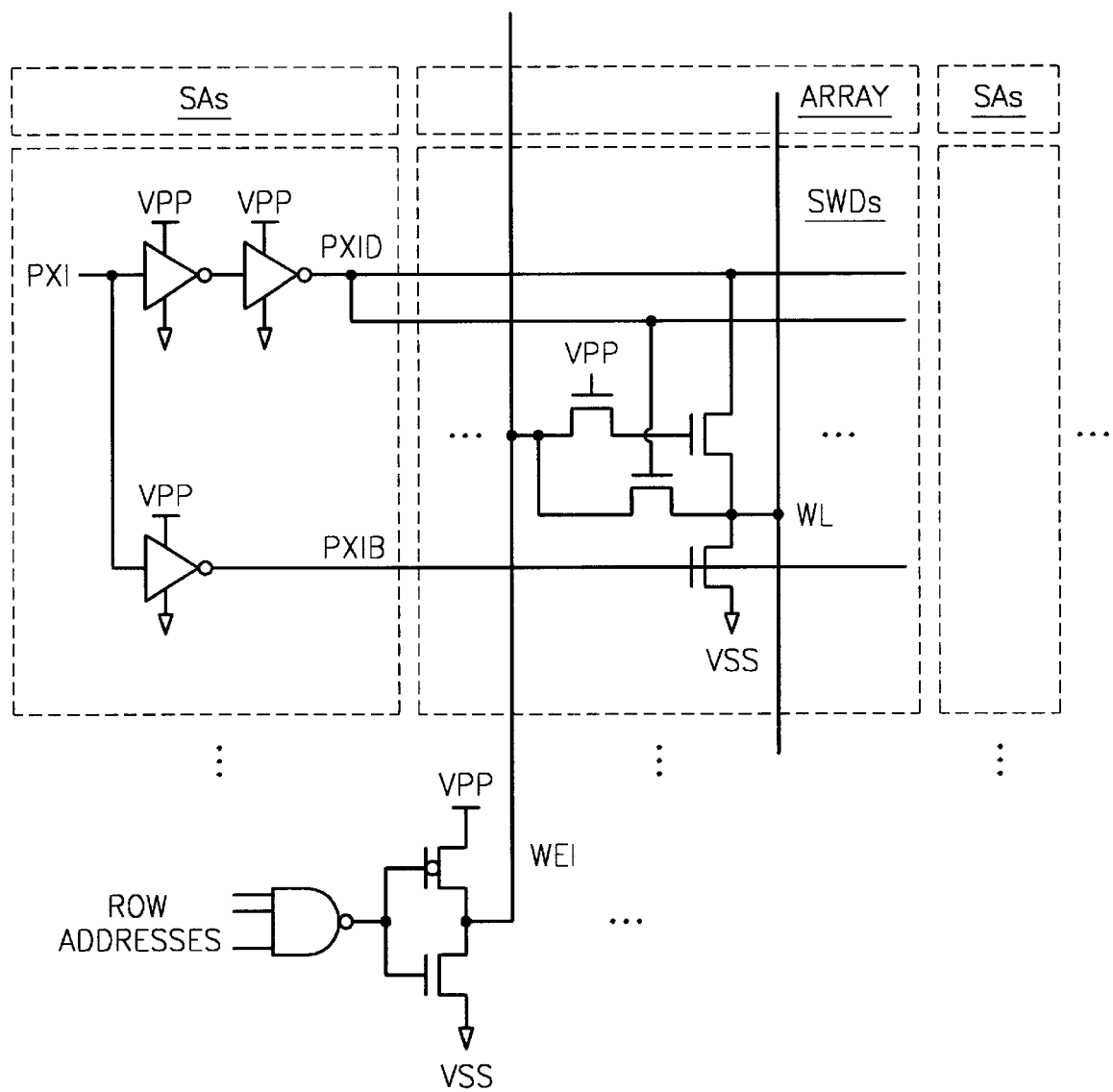
FIG. 14 illustrates a prior art arrangement of an NMOS sub-word line driver circuit, a PXID generator, and WEI driver.

FIG. 14 illustrates a prior art arrangement of an NMOS sub-word line driver circuit, a PXID generator, and WEI driver. The timing sequence shown in FIG. 9 is applied to this arrangement to enable and disable the sub-word line WL. If the circuitry shown in FIG. 14 is referenced to Vbb in an attempt to implement a negatively biased word line scheme, excessive current is consumed from the negative voltage generator. These currents are: (i) the word line discharge current during a precharge operation, (ii) drive current for the PXI generators 42 and the PXID generators 40, and (iii) drive current for the WEI drivers 39. These high current components cause fluctuations in the Vbb supply voltage, in the word line "low" level, and degrade the cell refresh characteristics.

Figure 15:
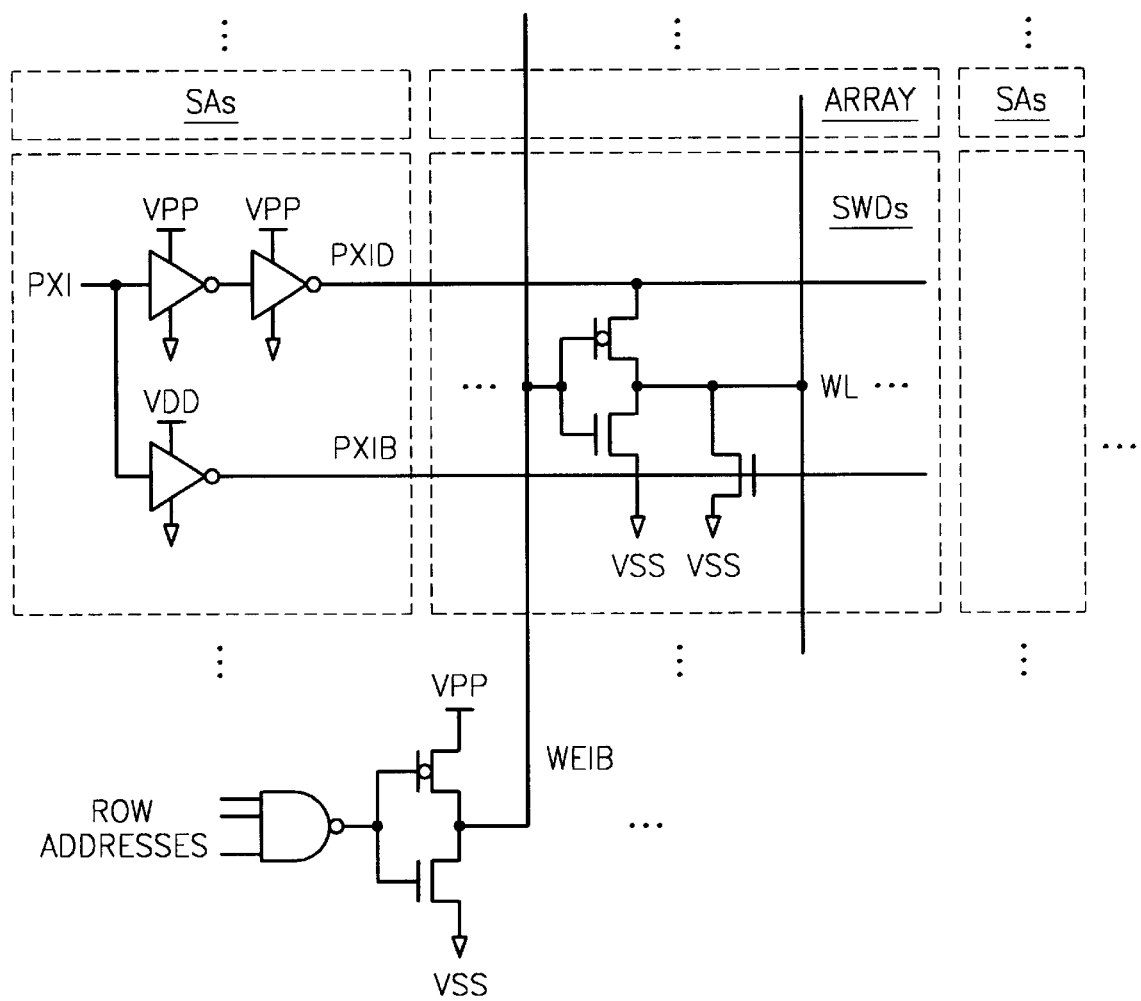
FIG. 15 illustrates a prior art arrangement of a CMOS sub-word line driver circuit, a PXID generator, and WEI driver.

FIG. 15 illustrates a prior art arrangement of a CMOS sub-word line driver circuit, a PXID generator, and WEI driver. The timing sequence shown in FIG. 11 is applied to this arrangement to enable and disable the sub-word line WL. Attempts to implement a negatively biased word line scheme with the arrangement of FIG. 15 suffers from the same problems discussed above with respect to FIG. 14.

Embodiment 4

Figure 16:
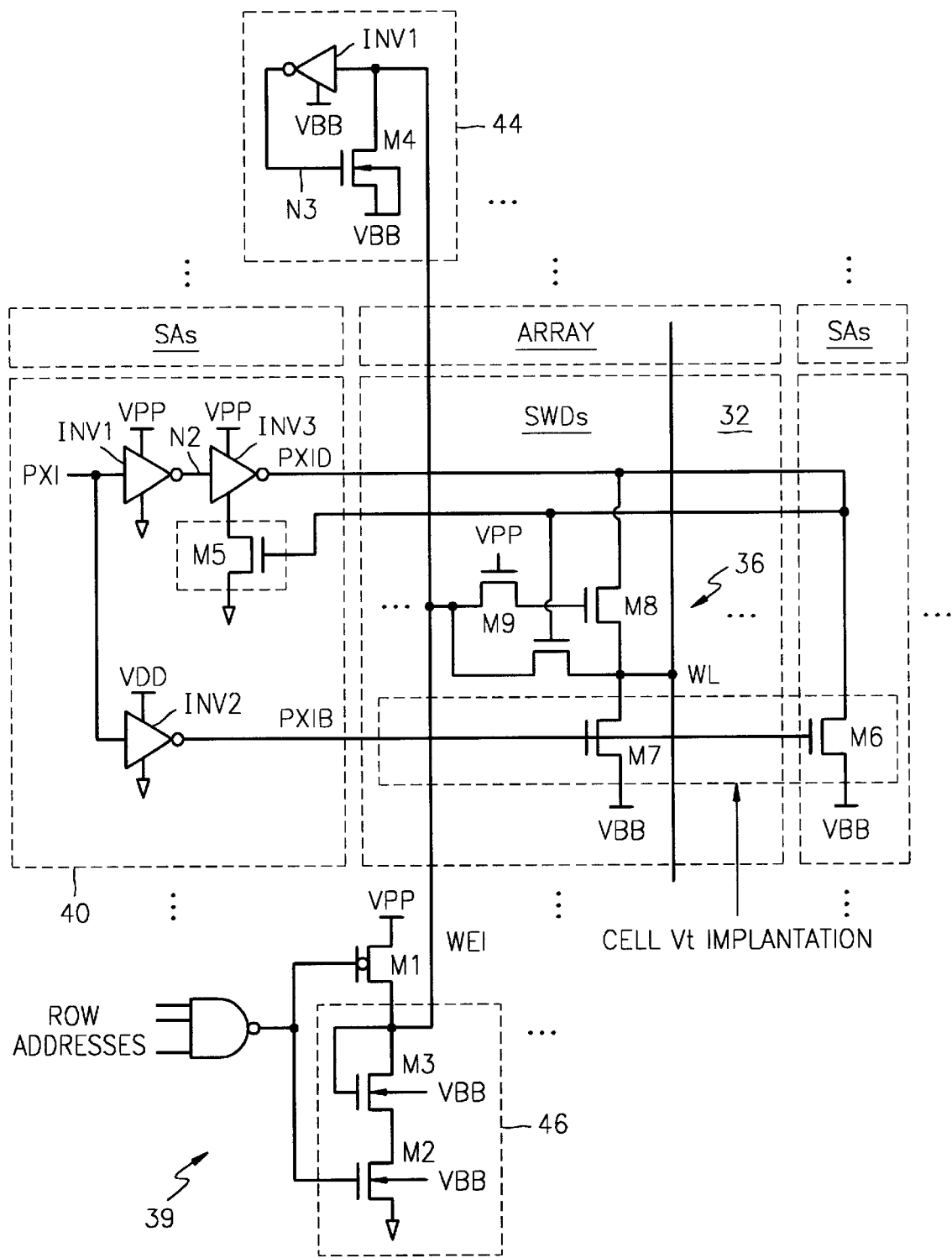
FIG. 16 illustrates a fourth embodiment of a memory device in accordance with the present invention.

FIG. 16 illustrates a fourth embodiment of a memory device in accordance with the present invention. The arrangement shown in FIG. 16 is in some respects similar to the NMOS sub-word line driver scheme shown in FIG. 14, but with the following modifications. The common power supply terminal of inverter INV3 in PXID generator 40 is connected to Vss through an NMOS transistor M5. The gate of M5 is connected to the PXID line. The source of M7 is connected to Vbb, as is the source of transistor M6 which has its drain connected to PXID and its gate connected to PXIB. The drive stage in WEI driver 39 has a modified driver section 46 that is constructed in the same manner as the modified drive section 22 shown in FIG. 4. A keeping circuit 44, which is constructed in the same manner as the keeping circuit 20 shown in FIG. 4, is connected to the word line enable signal WEI.

A precharge operation in accordance with the present invention will now be described with reference to FIG. 16.

The same timing sequence shown in FIG. 9 is applied to the circuit of FIG. 16. To begin the precharge operation, PXI goes low (i.e., to Vss) which causes node N2 and PXIB to go high (i.e., to Vpp). During the early part of the precharge operation, PXID remains at Vpp due to the large capacitive loading of the sub-word line WL. Since PXID discharges slowly, M5 turns on and most of the word line discharge current flows to Vss through M5 and M8 until the voltage level of PXID reaches the threshold voltage Vth of M5. Therefore, in this example, the sub-word line is coupled to Vss and then uncoupled from Vss responsive to the voltage of the word line. When PXID drops below Vth of M5, transistor M5 turns off and the sub-word line WL is further discharged to Vbb through transistors M6 and M7. When the voltage of WL reaches Vbb, M6 and M7 keep the WL and PXID lines at Vbb. Thus, most of the word line discharge current is diverted from Vbb to Vss.

Shortly after PXID goes low, the row address decoder causes WEI to discharge through M2 and M3 until WEI reaches the threshold voltage Vth of M3. When the voltage of WEI decreases sufficiently to cause the output inverter INV1 to go high, transistor M4 turns on and further discharges WL to Vbb. The keeping circuit 44 then keeps WL at Vbb to prevent unwanted current flow back through PXID. Thus, discharge current from the word line enable signal WEI is also diverted to Vss.

In a preferred embodiment, the keeping circuits 44 are arranged on the opposite side of the array 30 from the WEI drivers. This makes implementation easier because otherwise it is difficult to accommodate the keeping circuits in the row decoder region due to the small WEI line pitch.

As shown in FIG. 16, the signal swing of inverter INV2 is preferably set to Vss-to-Vdd to eliminate Vbb current consumption that would occur if PXIB were driven all the way down to Vbb.

In a preferred embodiment, the threshold voltages Vth of transistors M6 and M7 are increased to reduce sub-threshold current flow through M6 and M7. This can be accomplished by fabricating M6 and M7 using the same cell Vth implantation process that is used to fabricate the cell access transistors. Thus, the present invention can further reduce current consumption from the negative voltage supply without requiring additional process steps and with a minimum chip area penalty.

Transistor M6 is located in the conjunction area on the right-hand side of FIG. 16 to save space in the conjunction area in which inverters INV2, INV3 and INV4 are located. This is convenient because the dual PXID lines shown in FIG. 16 are already routed in the arrangement shown in FIG. 14. Thus, an advantage of the present invention is that it allows an existing memory device design to be easily modified in accordance with the present invention.

As described above, an advantage of the embodiment shown in FIG. 16 is that it reduces the current consumption from the negative voltage source because most of the word line discharge current is diverted to Vss. A further advantage is that it minimizes the Vbb current required for the sub-word line control circuitry. Yet another advantage is that timing sequence required for the precharge operation does not need to be changed.

Embodiment 5

Figure 17:
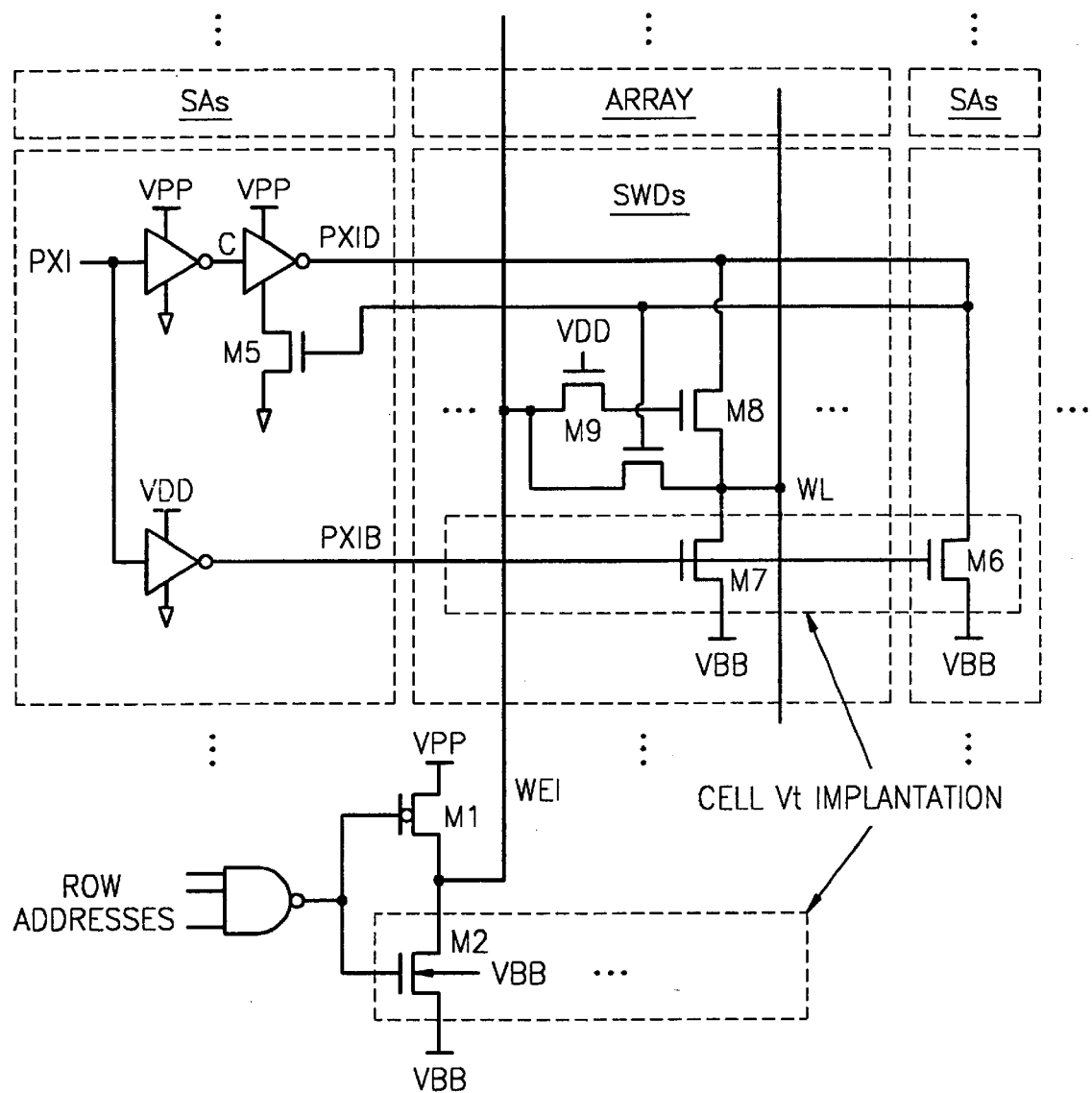
FIG. 17 illustrates a fifth embodiment of a memory device in accordance with the present invention.

FIG. 17 illustrates a fifth embodiment of a memory device in accordance with the present invention. The arrangement shown in FIG. 17 is similar to the NMOS sub-word line driver scheme shown in FIG. 16, but the diode connected transistor M3 has been removed from the drive stage. Instead, NMOS transistor M2 is implemented using cell Vth implantation, and its source is connected directly to Vbb. The keeping circuit is eliminated. During a precharge operation, when WEI transitions to the low logic level, WEI is discharged directly to Vbb through M2. Because M2 is implemented with cell Vth implantation, the row address decoder can still be referenced to Vss without causing sub-threshold current flow through M2. Although the arrangement shown in FIG. 17 couples normal word line discharge current to Vbb, the capacitive loading of WEI is relatively low, and the embodiment of FIG. 17 has the further advantage that it eliminates the need for the keeping circuit.

Embodiment 6

Figure 18:
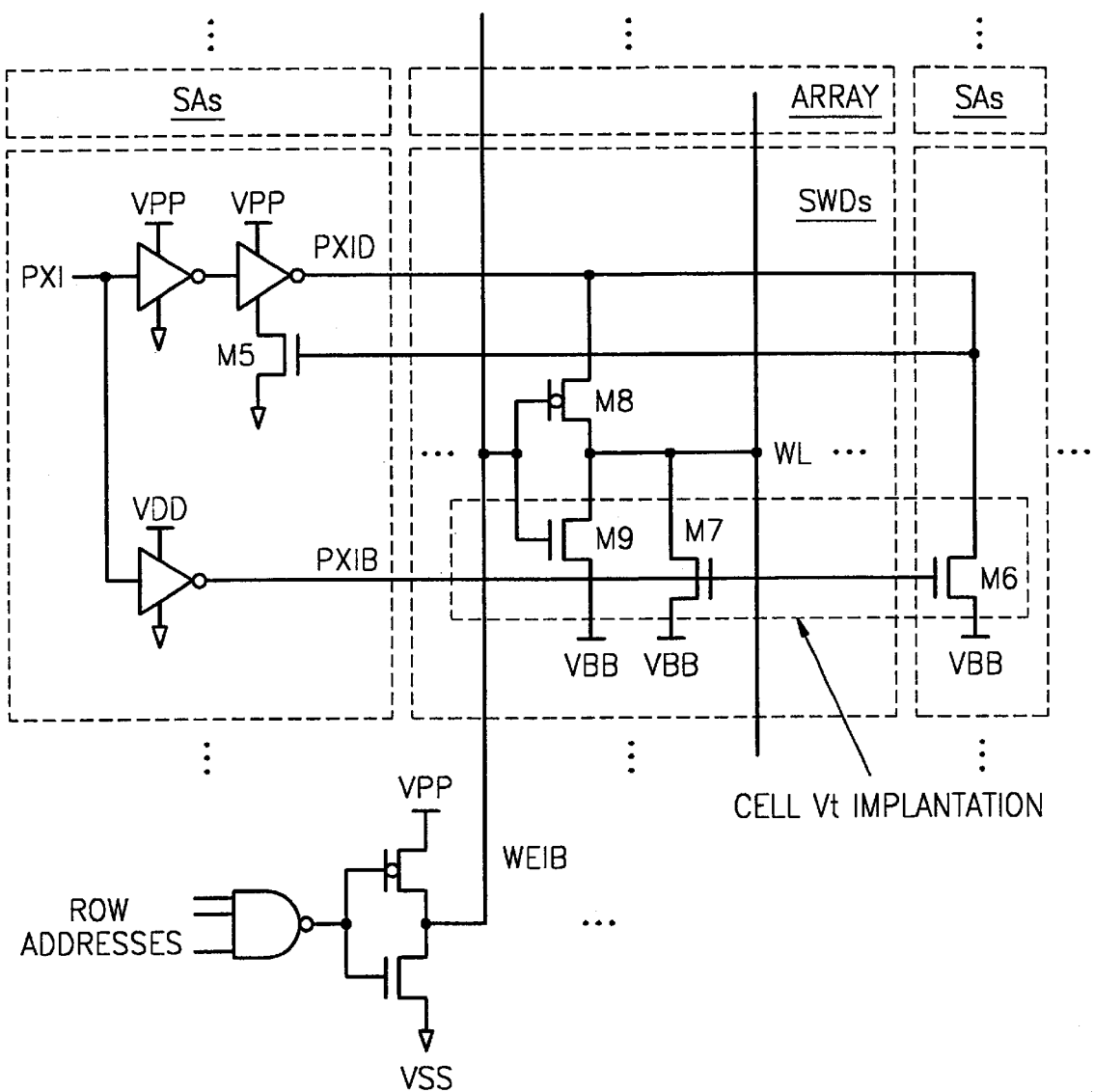
FIG. 18 illustrates a sixth embodiment of a memory device in accordance with the present invention.

FIG. 18 illustrates a sixth embodiment of a memory device in accordance with the present invention. The arrangement shown in FIG. 18 employs a CMOS sub-word line driver such as that shown in FIG. 15, but the PXID generator 40 has been modified to include transistor M5 to uncouple inverter 1NV3 from Vss in accordance with the present invention after most of the word line discharge current has been diverted to Vss. Transistor M6 has been added to couple the PXID line to Vbb responsive to PXIB. Also, transistors M6, M7 and M9 are implemented with cell Vth implantation.

The same timing sequence shown in FIG. 11 is applied to the embodiment of FIG. 18. The PXID generator diverts sub-word line discharge current to Vss in the same manner as the circuit of FIG. 16. A further benefit of the embodiment of FIG. 18, however, is that the word line enable signal WEIB is discharged to Vss through M2, thereby reducing the current consumption of Vbb. The word line enable signal WEIB can be referenced to Vss because transistors M6, M7 and M9 are implemented with cell Vth implantation. Thus, the keeping circuit is eliminated. The embodiment of FIG. 18 provides a compact, easy implementation of a negatively biased sub-word line scheme with low Vbb current demand and minimum chip area penalty.

Embodiment 7

Figure 19:
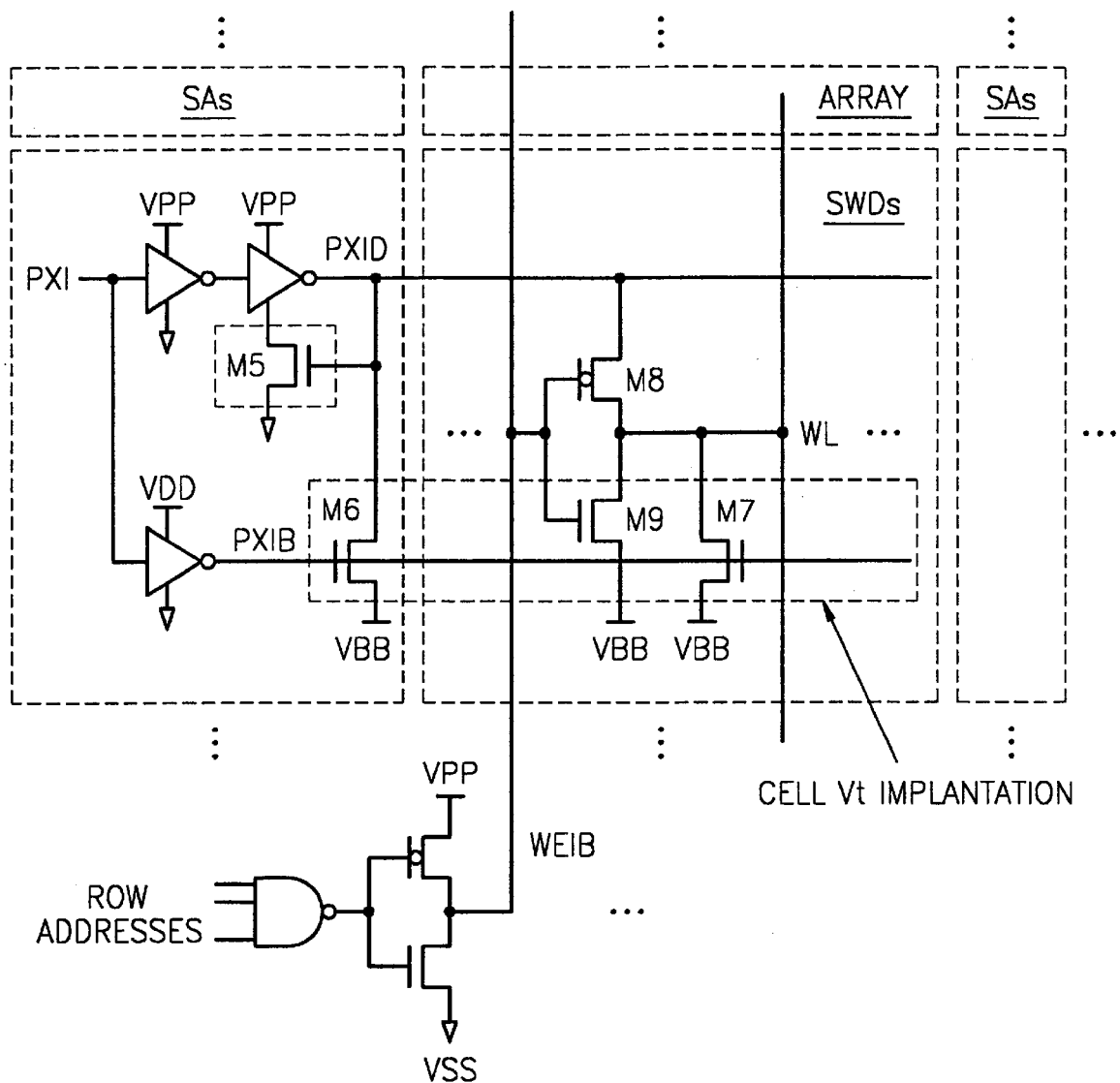
FIG. 19 illustrates a seventh embodiment of a memory device in accordance with the present invention.

FIG. 19 illustrates a seventh embodiment of a memory device in accordance with the present invention. The arrangement shown in FIG. 19 is in most ways similar to the embodiment of FIG. 18, but transistor M6 has been moved to the conjunction area having the PXID generator on the left side of the array. This eliminates the dual PXID lines routed all the way across the sub-word line driver (SWD) 32.

As a further variation, if the keeping circuit and modified WEI driver of FIG. 16 are used with either of the embodiments of FIGS. 18 and 19, then transistors M6, M7 and M9 can be implemented without the cell Vth implantation.

Having described and illustrated the principles of the invention in a preferred embodiment thereof, it should be apparent that the invention can be modified in arrangement and detail without departing from such principles. For example, the embodiments are described above in the context of DRAM memory devices, however, the present invention is not limited to DRAM word line drivers. As a further example, the embodiments described above implement negative biased word line schemes. However, negative biased is understood to mean a potential of opposite polarity from that applied to the word line during the active mode.

Also, as described above, during precharge operations in accordance with the present invention, word lines are coupled to various power supplies in response to changing addresses or specific voltages on word lines, but the present invention also contemplates that these coupling operations can be performed in response to other stimuli as well. Moreover, word line discharge current is described as being diverted to a power supply other than Vbb. However, in this context, power supply refers not only to a voltage source such as Vss, but also to any suitable current sink for diverting discharge current from a word line.

What is claimed is:

1. A method for discharging a word line comprising:
   coupling the word line to a first power supply; and
   diverting current from the word line to a second power supply.

2. A method according to claim 1 wherein coupling the word line to the first power supply comprises coupling the word line to the first power supply responsive to a voltage of the word line.

3. A method according to claim 1 wherein coupling the word line to the first power supply comprises coupling the word line to the first power supply responsive to row address information.

4. A method according to claim 1 wherein the word line is a main word line.

5. A method according to claim 4 wherein diverting current from the word line to the second power supply comprises:
   coupling the word line to the second power supply; and
   uncoupling the word line from the second power supply after substantial word line discharge current has been diverted to the second power supply.

6. A method according to claim 5 wherein coupling the word line to the second power supply comprises coupling the word line to the second power supply responsive to row address information.

7. A method according to claim 5 wherein uncoupling the word line from the second power supply comprises turning off a diode when a voltage of the word line reaches a threshold voltage of the diode.

8. A method according to claim 1 wherein the word line is a sub-word line which is driven by a sub-word line driver responsive to a word line enable signal and a PX line.

9. A method according to claim 8 further comprising coupling the word line enable signal to the first power supply.

10. A method according to claim 9 wherein coupling the word line enable signal to the first power supply comprises coupling the word line enable signal to the first power supply responsive to a voltage of the word line enable signal.

11. A method according to claim 9 wherein coupling the word line enable signal to the first power supply comprises coupling the word line enable signal to the first power supply responsive to row address information.

12. A method according to claim 11 wherein the word line enable signal is coupled to the first power supply through a transistor having the same cell Vth implantation process that is used to fabricate cell access transistors.

13. A method according to claim 9 further comprising diverting current from the word line enable signal to the second power supply.

14. A method according to claim 13 wherein current is diverted from the word line enable signal to the second power supply responsive to row address information.

15. A method according to claim 8 wherein diverting current from the word line to the second power supply comprises:
   driving the PX line with an inverter referenced to the second power supply; and
   uncoupling the inverter from the second power supply after substantial word line discharge current has been diverted to the second power supply.

16. A method according to claim 15 wherein uncoupling the inverter from the second power supply comprises uncoupling the inverter responsive to a voltage of the PX line.

17. A method according to claim 8 further comprising coupling the PX line to the first power supply responsive to row address information.

18. A method for discharging a word line comprising:
   coupling the word line to a first power supply; and
   diverting current from the word line to a second power supply responsive to a voltage of the word line.

19. A method according to claim 18 wherein:
   the first power supply is a substrate power supply; and
   the second power supply is a ground power supply.

20. A method according to claim 18 wherein:
   the first power supply is a negative power supply; and
   the second power supply is a ground power supply.

21. A method for discharging a word line comprising:
   coupling the word line to a first power supply; and
   diverting current from the word line to a second power supply responsive to a row address.

22. A method according to claim 21 wherein:
   the first power supply is a substrate power supply; and
   the second power supply is a ground power supply.

23. A method according to claim 21 wherein:
   the first power supply is a negative power supply; and
   the second power supply is a ground power supply.

24. A method for discharging a word line comprising:
   coupling the word line to a first power supply; and
   diverting current from the word line to a second power supply;
wherein diverting current from the word line to the second power supply comprises:
   coupling the word line to the second power supply, and
   uncoupling the word line from the second power supply after substantial word line discharge current has been diverted to the second power supply.

25. A method according to claim 24 wherein coupling the word line to the second power supply comprises coupling the word line to the second power supply responsive to a voltage of the word line.

26. A method according to claim 24 wherein coupling the word line to the second power supply comprises coupling the word line to the second power supply responsive to a row address.

27. A method for discharging a sub-word line coupled to a sub-word line driver which is driven by a word line enable signal decoded by an upper row address and a PX line decoded by a lower row address, the method comprising:
   coupling the sub-word line to a first power supply;
   diverting current from the sub-word line to a second power supply; and
   coupling the word line enable signal to the first power supply.

28. A method according to claim 27 wherein diverting current from the sub-word line to the second power supply comprises:
   coupling the PX line to the second power supply responsive to the lower row address; and
   uncoupling the PX line from the second power supply after substantial discharge current has been diverted to the second power supply.

29. A method according to claim 27 further comprising diverting current from the word line enable signal to the second power supply.

30. A method according to claim 29 wherein diverting current from the word line enable signal comprises diverting current from the word line enable signal responsive to a voltage of the word line enable signal.

31. A method according to claim 29 wherein diverting current from the word line enable signal comprises diverting current from the word line enable signal responsive to the upper row address.

32. A semiconductor memory device comprising:
   a word line; and
   a word line driver circuit coupled to the word line and adapted to couple the word line to a first power supply during a precharge operation;
      wherein the word line driver circuit is adapted to divert word line discharge current to a second power supply during the precharge operation.

33. A semiconductor memory device according to claim 32 wherein:
   the word line is a main word line; and
   the word line driver circuit comprises a drive stage coupled to the main word line and adapted to divert word line discharge current to the second power supply during the precharge operation.

34. A semiconductor memory device according to claim 33 wherein the word line driver circuit further comprises a power supply keeping circuit coupled to the main word line.

35. A semiconductor memory device according to claim 34 wherein the power supply keeping circuit is arranged on a side of a memory array opposite a row decoder.

36. A semiconductor memory device according to claim 34 wherein:
   the power supply keeping circuit comprises:
      a first transistor coupled between the main word line and the first power supply, and
      an inverter coupled between the first transistor and the main word line; and
   the drive stage comprises:
      a second transistor coupled to the second power supply, and
      a diode coupled between the second transistor and the main word line.

37. A semiconductor memory device according to claim 33 wherein the drive stage comprises:
   a first transistor arranged to couple the main word line to the first power supply; and
   a second transistor arranged to divert word line discharge current to the second power supply.

38. A semiconductor memory device according to claim 32 wherein:
   the word line is a sub-word line; and
   the word line driver circuit comprises a sub-word line driver circuit adapted to drive the sub-word line responsive to a word line enable signal and a PX line.

39. A semiconductor memory device according to claim 38 wherein the sub-word line driver circuit comprises a transistor coupled between the sub-word line and the first power supply.

40. A semiconductor memory device according to claim 39 wherein the transistor is fabricated with the same cell Vth implantation process that is used to fabricate cell access transistors.

41. A semiconductor memory device according to claim 38 wherein the word line driver circuit further comprises conjunction circuitry coupled to the sub-word line driver circuit and adapted to drive a PXID line and a PXIB line responsive to row address information.

42. A semiconductor memory device according to claim 41 wherein the conjunction circuitry comprises:
   an inverter coupled to the PXID line and arranged to divert discharge current from the sub-word line to the second power supply; and
   a transistor coupled between the inverter and the second power supply and arranged to uncouple the PXID line from the second power supply after a substantial amount of discharge current has been diverted.

43. A semiconductor memory device according to claim 41 wherein the sub-word line driver circuit comprises:
   a first transistor coupled between the PXID line and the sub-word line, and arranged to operate responsive to the word line enable signal; and
   a second transistor coupled between the sub-word line and the first power supply, and arranged to operate responsive to the PXIB line.

44. A semiconductor memory device according to claim 43 wherein the conjunction circuitry comprises a third transistor coupled between the PXID line and the first power supply, and arranged to operate responsive to the PXIB line.

45. A semiconductor memory device according to claim 38 wherein the sub-word line driver circuit further comprises a drive stage coupled to the word line enable signal.

46. A semiconductor memory device according to claim 45 wherein:
   the drive stage comprises a first transistor coupled to the second power supply and arranged to operate responsive to row address information, and a diode coupled between the first transistor and the word line enable signal; and
   the sub-word line driver circuit further comprises a power supply keeping circuit coupled to the word line enable signal.

47. A semiconductor memory device according to claim 46 wherein the power supply keeping circuit comprises:
   a transistor coupled between the word line enable signal and the first power supply; and
   an inverter coupled between the transistor and the word line enable signal.

48. A semiconductor memory device comprising:
   a plurality of word lines; and
   a plurality of word line driver circuits coupled to the word lines and adapted to couple the word lines to a first power supply during a precharge operation;
wherein the word line driver circuits are adapted to divert word line discharge current to a second power supply responsive to a voltage of the corresponding word line during the precharge operation for each word line.

49. A semiconductor memory device according to claim 48 wherein:
   the first power supply is a substrate power supply; and
   the second power supply is a ground power supply.

50. A semiconductor memory device according to claim 48 wherein:
   the first power supply is a negative power supply; and
   the second power supply is a ground power supply.

51. A semiconductor memory device comprising:
   a plurality of word lines; and
   a plurality of word line driver circuits coupled to the word lines and adapted to couple the word lines to a first power supply during a precharge operation;

wherein the word line driver circuits are adapted to divert word line discharge current to a second power supply responsive to a row address during the precharge operation for each word line.

52. A semiconductor memory device according to claim 51 wherein:
the first power supply is a substrate power supply; and
the second power supply is a ground power supply.

53. A semiconductor memory device according to claim 51 wherein:
the first power supply is a negative power supply; and
the second power supply is a ground power supply.

54. A semiconductor memory device comprising:
a plurality of sub-word lines;
a plurality of sub-word line drivers coupled to the sub-word lines and adapted to couple the sub-word lines to a first power supply responsive to a plurality of word line enable signals and a plurality of PX signals during a precharge operation;
a plurality of PX signal generators coupled to the plurality of sub-word line drivers and adapted to generate the plurality of PX signals responsive to a lower row address; and
a row decoder coupled to the plurality of sub-word line drivers and adapted to generate the plurality of word line enable signals responsive to an upper row address;
wherein the plurality of PX signal generators are adapted to divert sub-word line discharge current to a second power supply responsive to the lower row address during the precharge operation for each word line.

55. A semiconductor memory device according to claim 54 wherein the row decoder is adapted to divert word line enable signal discharge current to the second power supply responsive to the upper row address during the precharge operation for each word line.

56. A semiconductor memory device according to claim 55 further comprising a plurality of power supply keeping circuits coupled to the word line enable signals and adapted to couple the word line enable signals to the first power supply responsive to a voltage of each word line enable signal.

57. A semiconductor memory device according to claim 54 wherein the row decoder is adapted to couple the word line enable signals to the first power supply responsive to the upper row address during the precharge operation for each word line.

58. A semiconductor memory device comprising:
a plurality of sub-word lines;
a plurality of sub-word line drivers coupled to the sub-word lines and adapted to couple the sub-word lines to a first power supply responsive to a plurality of word line enable signals and a plurality of PX signals during a precharge operation;
a plurality of PX signal generators coupled to the plurality of sub-word line drivers and adapted to generate the plurality of PX signals responsive to a lower row address;
a row decoder coupled to the plurality of sub-word line drivers and adapted to generate the plurality of word line enable signals responsive to an upper row address; and
a plurality of power supply keeping circuits coupled to the word line enable signals and adapted to couple the word line enable signals to the first power supply responsive to a voltage of each word line enable signal;

wherein the row decoder is adapted to divert word line enable signal discharge current to a second power supply responsive to the upper row address during the precharge operation for each word line.

59. A semiconductor memory device according to claim 58 wherein the row decoder is adapted to couple each word line enable signal to the second power supply responsive to the upper row address and uncouples each word line enable signal from the second power supply responsive to a voltage of each word line enable signal.

60. A semiconductor memory device comprising:
a word line;
means for coupling the word line to a first power supply during a precharge operation; and
means for diverting current from the word line to a second power supply during the precharge operation.

61. A semiconductor memory device according to claim 60 wherein:
the word line is a main word line; and
the means for diverting current from the word line to the second power supply comprises a drive stage.

62. A semiconductor memory device according to claim 61 wherein the means for coupling the word line to the first power supply comprises a power supply keeping circuit.

63. A semiconductor memory device according to claim 60 wherein:
the word line is a sub-word line; and
the means for diverting current from the word line to the second power supply comprises:
a sub-word line driver circuit coupled to the sub-word line, and
a conjunction circuit coupled to the sub-word line driver circuit and adapted to couple the sub-word line to the second power supply during the precharge operation and uncouple the sub-word line from the second power supply after substantial discharge current has been diverted to the second power supply.

64. A semiconductor memory device comprising:
a sub-word line;
means for driving the sub-word line responsive to a PX signal and a word line enable signal;
means for generating the PX signal responsive to a lower row address;
means for generating the word line enable signal responsive to an upper row address; and
means for coupling the word line enable signal to a first power supply during a precharge operation;
wherein the means for generating the PX signal is adapted to divert current from the sub-word line to a second power supply during the precharge operation.

65. A semiconductor memory device according to claim 64 wherein the means for coupling the word line enable signal to a first power supply comprises a power supply keeping circuit.

66. A semiconductor memory device according to claim 64 wherein the means for generating the word line enable signal is adapted to divert word line enable signal discharge current to the second power supply during the precharge operation.

67. A semiconductor memory device according to claim 64 wherein the means for driving the sub-word line is adapted to couple the sub-word line to the first power supply during the precharge operation.

68. A semiconductor memory device comprising:
a sub-word line;

means for driving the sub-word line responsive to a PX signal and a word line enable signal;

means for generating the PX signal responsive to a lower row address; and means for generating the word line enable signal responsive to an upper row address;

wherein the means for driving the sub-word line is adapted to couple the sub-word line to a first power supply during a precharge operation; and wherein the means for generating the PX signal is adapted to divert current from the sub-word line to a second power supply during the precharge operation.

69. A semiconductor memory device according to claim 68 wherein the means for generating the word line enable signal is adapted to couple the word line enable signal to the first power supply during the precharge operation.

70. A semiconductor memory device according to claim 68 wherein the means for generating the word line enable signal is adapted to divert word line enable signal discharge current to the second power supply during the precharge operation.

* * * * *

UNITED STATES PATENT AND TRADEMARK OFFICE
CERTIFICATE OF CORRECTION

PATENT NO. : 6,545,923 B2  Page 1 of 1
DATED : April 8, 2003
INVENTOR(S) : Sim et al.

It is certified that error appears in the above-identified patent and that said Letters Patent is hereby corrected as shown below:

Column 6,
Line 59, "which has its drain" should read -- which has its source --.

Column 8,
Line 59, "the embodiments are" should read -- the example embodiments are --.

Column 14,
Line 8, "and uncouples each" should read -- and uncouple each --.

Signed and Sealed this

Eleventh Day of May, 2004

JON W. DUDAS
*Acting Director of the United States Patent and Trademark Office*